US012016164B1

(12) United States Patent
Hwang et al.

(10) Patent No.: US 12,016,164 B1
(45) Date of Patent: Jun. 18, 2024

(54) RF FILTER DEVICE FOR AIRCRAFT NACELLE ACCESS DOOR GAP

(71) Applicant: The Boeing Company, Arlington, VA (US)

(72) Inventors: Kyu-Pyung Hwang, Newton, MA (US); Thomas D. Mitchum, N. Charleston, SC (US); Philipp Andreas Boettcher, Golden, CO (US); Young Song, Huntington Beach, CA (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 18/313,724

(22) Filed: May 8, 2023

(51) Int. Cl.
*H05K 9/00* (2006.01)
*B64D 45/00* (2006.01)
*H01Q 15/00* (2006.01)
*H05K 1/02* (2006.01)
*B64D 29/08* (2006.01)

(52) U.S. Cl.
CPC ........... *H05K 9/0024* (2013.01); *B64D 45/00* (2013.01); *H01Q 15/006* (2013.01); *H01Q 15/008* (2013.01); *H05K 1/0236* (2013.01); *H05K 9/0009* (2013.01); *B64D 29/08* (2013.01)

(58) Field of Classification Search
CPC ... H01Q 15/006; H01Q 15/008; H05K 9/0009
See application file for complete search history.

(56) References Cited

U.S. PATENT DOCUMENTS

| 5,841,067 A | * | 11/1998 | Nakamura | ........... H05K 9/0045 174/382 |
| 2009/0080172 A1 | * | 3/2009 | Arslan | ................. H05K 1/0236 361/816 |
| 2009/0308653 A1 | * | 12/2009 | Wu | ........................ H01Q 1/526 361/818 |
| 2014/0049437 A1 | * | 2/2014 | Hung | ................... H01Q 15/006 343/841 |
| 2018/0277946 A1 | * | 9/2018 | Murata | ..................... H01Q 1/48 |
| 2022/0007553 A1 | * | 1/2022 | Koyama | ................ D06M 11/83 |

OTHER PUBLICATIONS

S. P. Rea et al., Broadband high-impedance surface design for aircraft HIRF protection, IEE Proc .- Microw. Antennas Propag., vol. 153, No. 4, pp. 307-313, Aug. 2006.

(Continued)

*Primary Examiner* — Hung V Ngo
(74) *Attorney, Agent, or Firm* — Jordan IP Law, LLC

(57) ABSTRACT

An assembly for electromagnetic interference (EMI) shielding to prevent incident radiation from penetrating through a gap to an interior of an aircraft includes an electromagnetic band gap (EBG) structure. The EBG structure has a patch-and-via array connected to a ground layer. The EMI shielding includes a conductive adhesive and is flexible for conforming attachment to curved aircraft surfaces. The shielding may be located on a deflector plate that is parallel to an adjacent aircraft surface, on the airframe surface opposite to the deflector plate, or in both locations. The assembly filters out penetrating electromagnetic energy and prevents highly resonant cavity mode build-ups of electromagnetic energy inside a nacelle or other enclosure effectively protecting electrical equipment in the interior.

20 Claims, 6 Drawing Sheets

(56) References Cited

OTHER PUBLICATIONS

D. Sieveniper et al., High-impedance electromagnetic surfaces with a forbidden band, IEEE Trans. Microwave Theory & Techniques, vol. 47, No. 11, Nov. 1999.
Kamgaing et al., Design and modeling of high impedance electromagnetic surfaces for switching noise suppression in power planes, IEEE Trans. Electromagn. Compt., vol. 47, No. 3, Aug. 2005.

* cited by examiner

RF FILTER DEVICE FOR AIRCRAFT NACELLE ACCESS DOOR GAP

FIELD

This disclosure relates to aircraft and more particularly to improved protection of aircraft electronics against electromagnetic interference.

BACKGROUND

Various electronic equipment is located inside throughout an aircraft. Some electronic equipment is located proximate to openings to the outside of the aircraft. These openings are closed with movable covers to provide access for service and repair. In some locations of the aircraft, the gaps around the openings are sealed and tightly covered. In other locations, narrow gaps and slots around the openings allow for thermal expansion and contraction, provide tolerance for mechanical vibration, and serve as locations for sensors and other systems. One such location is an aircraft nacelle. The nacelle, which houses the aircraft engine, turbine, and control electronics, has large access doors. Electronic equipment, such as a full authority digital engine controller (FADEC), in such locations is particularly susceptible to electromagnetic interference (EMI). EMI can penetrate gaps and can cause avionic equipment performance to degrade or even malfunction. EMI can come from various sources, both internal and external to the aircraft, such as lightning, solar flares, and electrostatic discharge. Also, one type of EMI is radio frequency interference (RFI). RFI sources external to the aircraft include high-intensity radiated field (HIRF) from radar, radio, television and other ground-based, shipborne or airborne radio frequency transmitters, electromagnetic pulse (EMP) and high power microwave (HPM) irradiation, all of which, can penetrate the aircraft at these gap locations and impact aircraft electronic systems. While protective conductive seals are currently used in the vicinity of gap locations, they are not effective against all possible electromagnetic penetrations and are also costly and troublesome to maintain. Therefore, improved and effective protection against EMI/RFI is needed.

SUMMARY

In accordance with one or more examples, an assembly for electromagnetic interference shielding of an interior of an aircraft includes a first external surface and a second external surface having an inner surface, the first external surface being contiguous with the second external surface and defining a gap therebetween, a deflector plate located in the interior, the deflector plate having a gap-facing surface parallel and adjacent to the inner surface of the second external surface, and a first shielding located on the gap-facing surface, the first shielding including a first electromagnetic band gap structure.

In accordance with one or more examples, an assembly for electromagnetic interference shielding of an interior of an aircraft includes a first external surface and a second external surface having an inner surface, the first external surface being contiguous with the second external surface and defining a gap therebetween, a deflector plate located in the interior and having a gap-facing surface parallel to and opposite from the inner surface of the second external surface, and a first shielding located on the inner surface of the second external surface, the first shielding including a first electromagnetic band gap structure.

In accordance with one or more examples, an electromagnetic interference shielding includes an electromagnetic band gap structure including an array of unit cells across a length and a width, each unit cell comprising a flat conductive patch parallel to the length and width, each patch having an inner surface, and a conductive via connected to the inner surface of the patch, a conductive ground layer having an inner surface and an outer surface, the via extending from the patch to the inner surface of ground layer, a substrate layer of dielectric material located between the patches and the ground layer, and a conductive adhesive layer connected to the outer surface of the ground layer.

The features, functions, and advantages that have been discussed can be achieved independently in various examples or may be combined in yet other examples further details of which can be seen with reference to the following description and drawings.

DESCRIPTION OF THE DRAWINGS

The various advantages of the examples of the present disclosure will become apparent to one skilled in the art by reading the following specification and appended claims, and by referencing the following drawings in which:

DETAILED DESCRIPTION

An assembly for EMI shielding to prevent incident radiation from penetrating through a gap to an interior of an aircraft comprises an electromagnetic band gap (EBG) structure. The EMI shielding may be located on interior airframe structures near gaps. The assembly filters out penetrating electromagnetic energy and prevents highly resonant cavity mode build-ups of electromagnetic energy inside a nacelle or other enclosure effectively protecting electrical equipment located in the interior.

Figure 1:
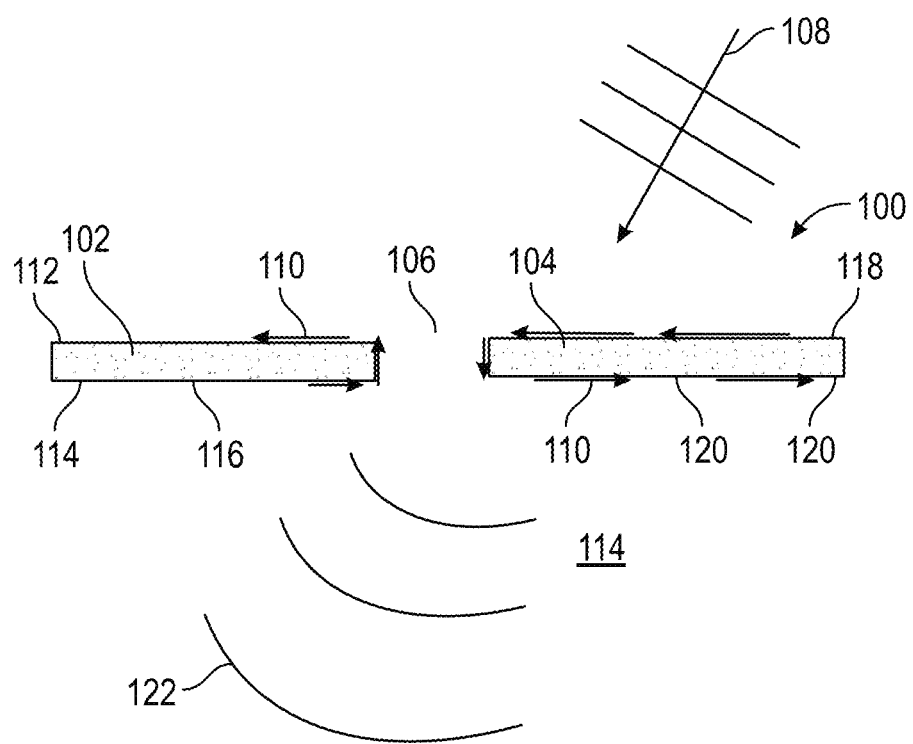
FIG. 1 is a schematic diagram showing an aircraft section having an opening.

FIG. 1 is a schematic diagram of an exemplary section of an aircraft skin 100 showing a first external aircraft surface 102 and a second external aircraft surface 104 defining a gap 106 therebetween. The aircraft skin 100 is made from aluminum or aluminum alloy. FIG. 1 illustrates two external aircraft surfaces 102, 104 of the same material. The illustrated aircraft section of FIG. 1 may be any location on the surface of an aircraft or an interface location of the same material or different material. The exemplary gap 106 is illustrative of any aperture, seam, joint, opening, orifice, slot or any other interface location found on an aircraft including but not limited to an aircraft body panel, an access door, a sensor aperture, a window, a port, a nacelle and cowl door.

FIG. 1 illustrates a plane wave 108 incident upon the aircraft section 100 indirectly illuminating the gap 106 and generating a surface current 110 represented by the arrows. This surface current 110 will flow along an outer surface 112 of the first external surface 102 and penetrate to an interior 114 of the aircraft via the gap 106 and flow along an inner surface 116. Similarly, a surface current 110 will flow along an outer surface 118 of the second external surface 104 and penetrate to the interior 114 of the aircraft via the gap 106 and flow along an inner surface 120. The low impedance of the aluminum aircraft skin allows current to flow over the entire metal surface. The electromagnetic field levels inside the interior 114 will increase as a result of surface current and any transmitted wave 122 penetration via the gap 106 and may cause interference with avionic systems that are located in the interior 114.

Figure 2A:
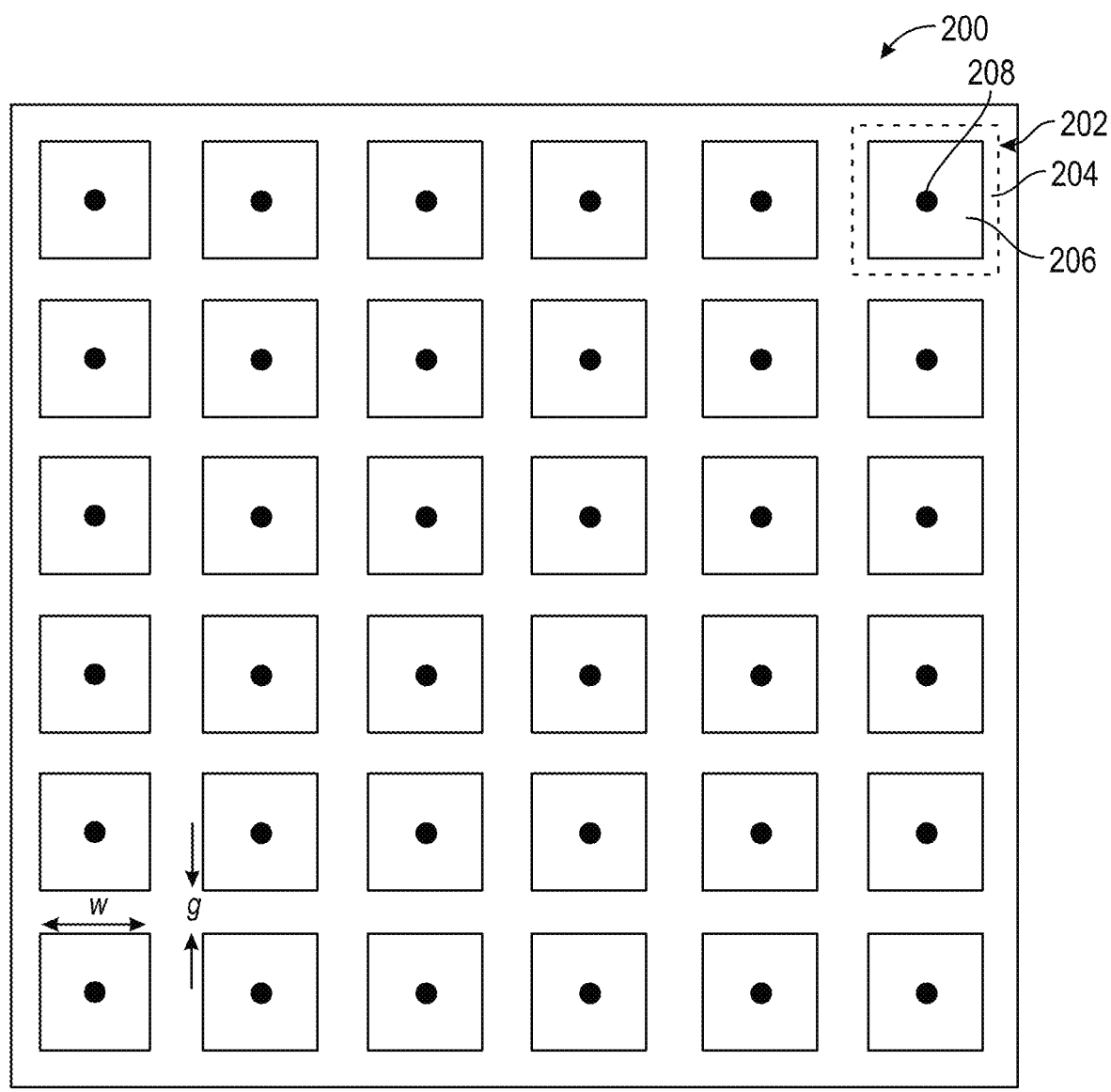
FIG. 2A is a schematic diagram showing a top view of an electromagnetic band gap structure, according to one or more examples.
Figure 2B:
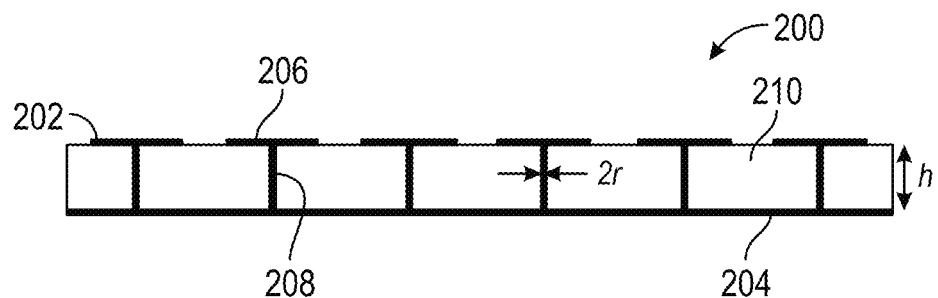
FIG. 2B is a schematic diagram showing a side-elevational view of the electromagnetic band gap structure of FIG. 2A, according to one or more examples.

FIGS. 2A and 2B shows an electromagnetic band gap (EBG) structure 200. The EBG structure 200 includes unit cells 202 repeated many times in a two-dimensional pattern to form a broadband high-impedance surface (HIS). Each unit cell 202 includes a bottom metal ground plane layer 204, a metal patch 206, and a conducting via 208 having a diameter, 2r, extending and interconnected between the two. Each unit cell 202 forms a mushroom-like unit extending from the ground. FIG. 2A illustrates an EBG structure 200 having a 6×6 array of unit cells 202. Any size array may be employed. Additionally, a substrate 210 may be included between the ground plane layer 204 and the patch 206. The ground plane layer 204 in FIG. 2A is a common ground for all the unit cells 202. In another embodiment, the ground plane layer 204 may be divided. The ground plane layer 204 can be made of any conductive metal such as aluminum or copper. The patch 206 is square having a side length of w; however, any suitable patch shape may be employed such as circular or polygonal. The patch 206 can be made of any conductive metal such as aluminum or copper. The dimensions of the patch 206 are selected such that there is a specific separation distance, g, in between neighboring patches 206 in all directions. Each unit cell's along-the-plane dimensions are a small fraction of a wavelength in an operating range in order for the surface as a whole to appear electromagnetically homogeneous. Exemplary unit cell 202 dimensions are approximately 1.0-10.0 mm for the patch 206 length and width, w, approximately 0.1-5.0 mm for the separation distance, g, and approximately 3.0-15 mm for the substrate 210 thickness (patch height), h. The substrate 210 may be made of a dielectric material having a dielectric constant E r of approximately 1.0-3.0.

Figure 3:
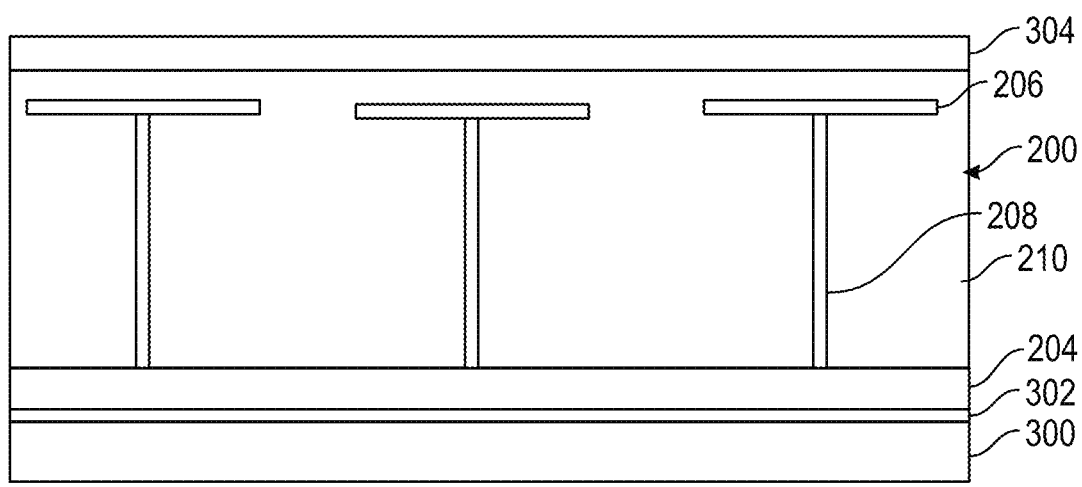
FIG. 3 is a schematic diagram showing a side-elevational view of an EMI shielding, according to one or more examples.

FIG. 3 illustrates the EBG structure 200 connected to a conducting airframe surface 300. The EBG structure 200 includes an adhesive layer 302. The adhesive layer 302 is conductive such that the ground plane layer 204 can be electrically connected to a conducting airframe surface 300. The adhesive layer 302 is configured such that the EBG structure 200 is electrically connected to the adhesive layer 302 which may be in the form of an adhesive tape having a conductive substrate backing with conductive adhesive arranged on two sides of the substrate backing with one side adhered to the ground plane layer 204 and another side for adhering to an airframe surface 300. Any type of conventional, pressure-sensitive conductive adhesive or conductive adhesive tape may comprise the adhesive layer 302. In one embodiment of the EBG structure 200 that includes the adhesive layer 302, the EBG structure 200 is flexible so that it may be easily and conformingly attached to curved surfaces commonly found on airframe surfaces. The EBG structure 200 is thin and flat and may be formed into a tape having dimensions suitable for a particular application. In one embodiment, the length is longer than its width and may be formed into a rolled strip for easy installation. The EBG structure 200 may also include a passivation layer 304 along the outer surface adjacent to the patches 206. The passivation layer 304 fills any gaps between the patches 206 and substrate 210 and serves as a blanket layer that provides environmental protection for the EBG structure 200.

Figure 4:
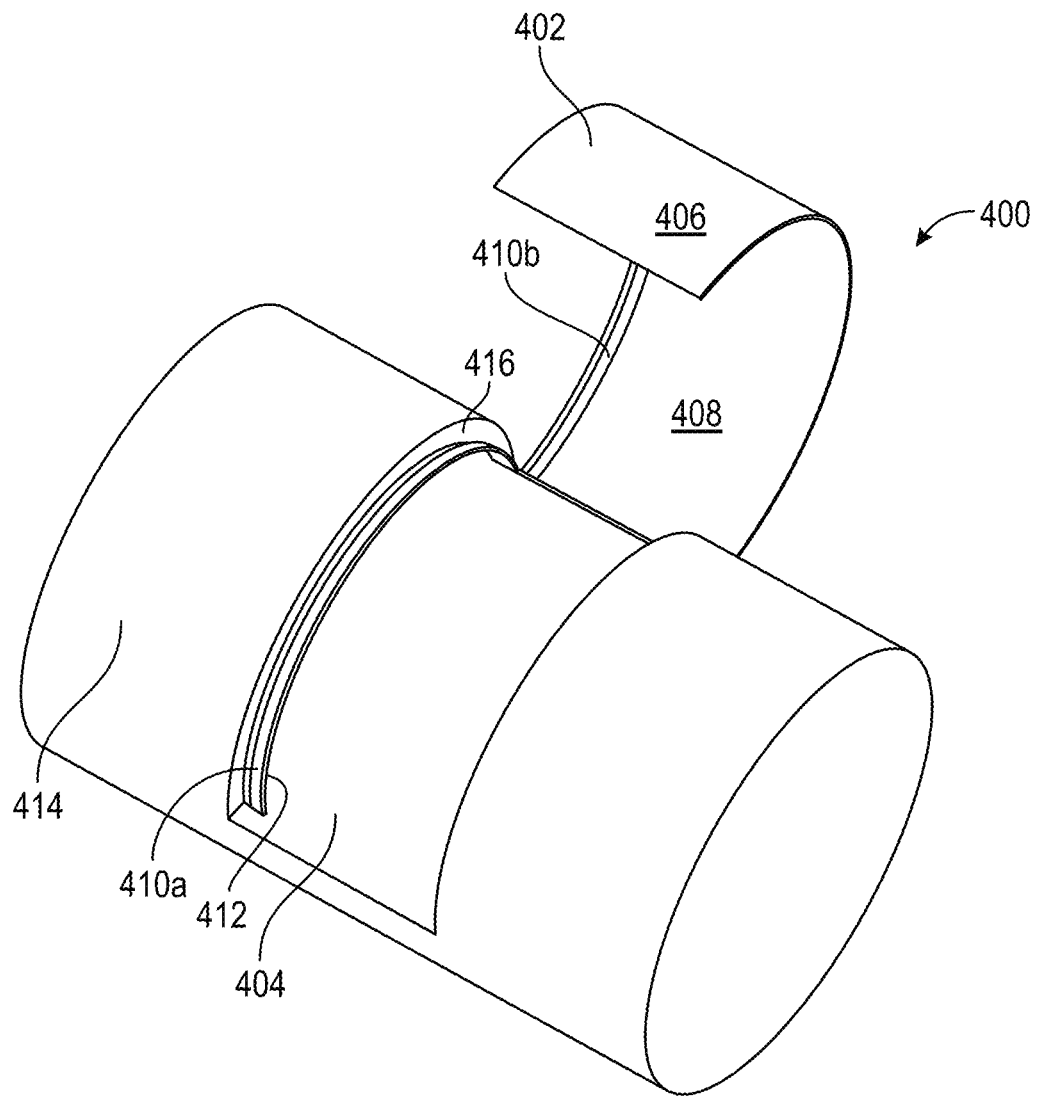
FIG. 4 is a schematic diagram showing a top perspective view of an aircraft nacelle with access doors open and EMI shielding, according to one or more examples.

FIG. 4 illustrates a schematic representation of a nacelle 400 with an open cowl access door 402 exposing an access opening 404. The nacelle 400 provides an annular housing within which a substantial portion of an aircraft engine is located. Although a nacelle 400 and access door 402 interface is illustrated as one embodiment, use in other locations of the nacelle 400 are also within the scope of the present disclosure. Also, other examples including applications to different locations of the aircraft or other types of vehicles such as ships or other platforms and land-based applications are within the scope of the present disclosure. The access door 402 has an outer surface 406 and an inner surface 408 and, when closed, the outer surface 406 of the access door 402 is contiguous with the skin of the nacelle 400. EMI shielding 410a, 410b comprising the EBG structure 200 is shown in two locations; however, EMI shielding 410 may be provided on one of the two locations. In a first location, the EMI shielding 410a is located on a deflector plate 412. The deflector plate 412 is made of conductive material. The deflector plate 412 is parallel to and recessed with respect to an outer surface 414 of the nacelle 400. The deflector plate 412 extends longitudinally from a radial interior surface 416 and is adjacent to the inner surface 408 of the access door 402. The EMI shielding 410a is connected to the deflector plate 412, such as with the aforementioned adhesive layer 302 or by other means, and extends circumferentially along the curved deflector plate 412 along one or more portion of the perimeter of the access opening 404. It is understood that the access door 402 may represent another panel, cover, window or the like and that the access opening 404 may represent any opening, aperture, slot or gap in the vehicle or platform. In a second location, the EMI shielding 410b is located on the inner surface 408 of the access door 402 adjacent to the edge of the access door 402 and in opposing parallel juxtaposition to the deflector plate 412. The EMI shielding 410b extends along one or more portion of the perimeter of the access door 402. FIG. 4 shows the EMI shielding 410a, 410b located at the distal end of interface. EMI shielding 410a, 410b may also be employed at a proximal end and/or at lateral sides of the perimetral interface.

Figure 5A:
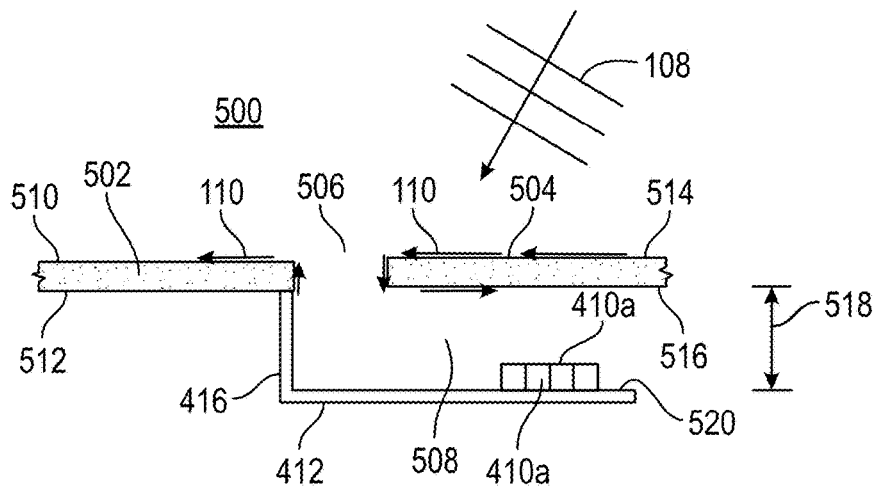
FIG. 5A is a schematic diagram showing an aircraft section having an opening shielded with EMI shielding in a first location, according to one or more examples.

FIG. 5A illustrates an electromagnetic wave 108 incident from an exterior 500 upon a vehicle section having EMI shielding 410a at an interface between an external first surface 502 and an external second surface 504 defining a gap 506 The gap 506 may be very small but sufficient to permit a surface current 110 to flow around an edge to an interior 508. The external first surface 502 may be an aircraft skin having an outer surface 510 and an inner surface 512.

The external second surface 504 may be a skin, nacelle access door, cover, window, panel, or the like, having an outer surface 514 and an inner surface 516. The external second surface 504 may be configured to cover or close an opening formed in the external first surface 502. A first perimeter is defined along the entire edge of the external first surface 502 and a second perimeter is defined along the entire edge of the external second surface 504. An interior surface 416 extends from the inner surface 512 of the external first surface 502 toward the interior 508. In one embodiment the interior surface 416 extends inwardly at the edge of at least a portion of the first perimeter. The interior surface 416 may be perpendicular to the external first surface 502 and, for a curved skin, the interior surface 416 will extend radially inwardly. A deflector plate 412 is connected to and extends laterally from the interior surface 416 extending below the gap 506 and below the external second surface 504. The deflector plate 412 may be parallel to the external second surface 504 defining a distance 518 therebetween. The distance 518 is constant and, if the external second surface 504 is curved, the deflector plate 412 is conformingly curved to maintain a constant distance 518 along the length and width of the deflector plate 412. The deflector plate 412 may extend along at least a portion of one or more edges of the first perimeter. The deflector plate 412 has a gap-facing surface 520 that faces the gap 506 and that faces the inner surface 516 of the external second surface 504. The EMI shielding 410a comprising the EBG structure 200 is attached to the gap-facing surface 520 of the deflector plate 412 via the adhesive layer 302 or by other means. A first edge of the EMI shielding 410a is laterally near the edge of the second perimeter. The second edge of the EMI shielding 410a terminates beneath the external second surface 504. The distance between the first edge and second edge of the EMI shielding 410 defines its width. The EMI shielding 410a extends along at least a portion of the length and width of the deflector plate 412. In one embodiment, the entire length and width of the EMI shielding 410a is positioned directly beneath the external second surface 504 such that the EMI shielding 410a is not located beneath the gap 506.

Figure 5B:
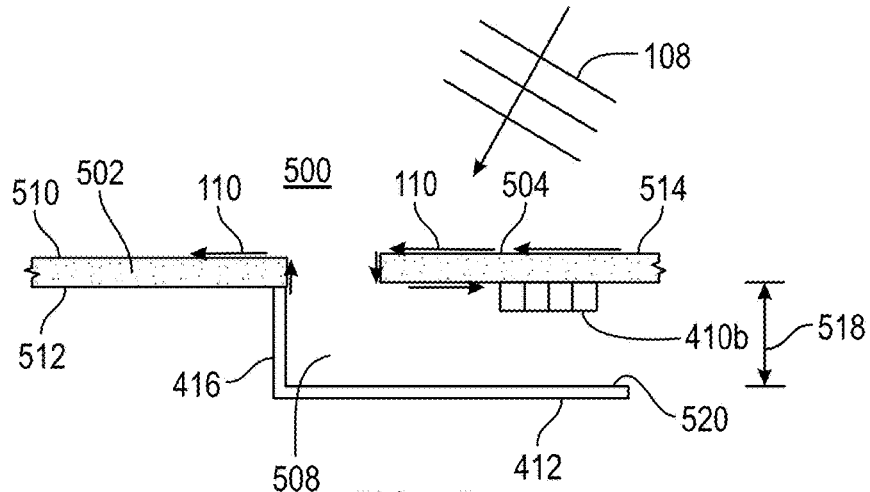
FIG. 5B is a schematic diagram showing an aircraft section having an opening shielded with EMI shielding in a second location, according to one or more examples.

FIG. 5B illustrates the same vehicle section as in FIG. 5A. In the embodiment of FIG. 5B, the EMI shielding 410b is attached to the inner surface 516 of the external second surface 504 via the adhesive layer 302 or other means. The EMI shielding 410b is proximate to the gap 40 such that a first edge of the EMI shielding 410b is near or at the edge of the external second surface 504. In one embodiment, a second edge of the EMI shielding 410b terminates opposite the deflector plate 412. The distance between the first and the second edge of the EMI shielding 410b defines its width. The EMI shielding 410b extends along at least a portion of the length and width of the external second surface 504 and along at least a portion of second perimeter.

Figure 5C:
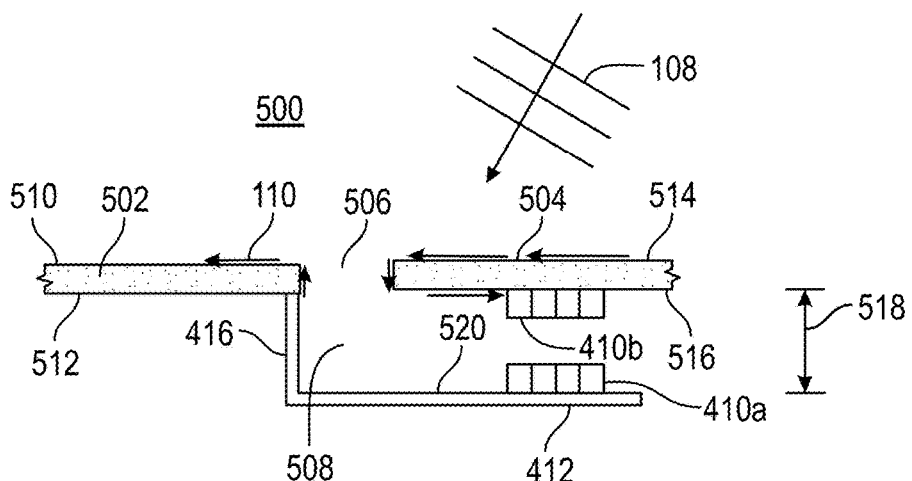
FIG. 5C is a schematic diagram showing an aircraft section having an opening shielded with EMI shielding in a first and second location, according to one or more examples.

FIG. 5C illustrates the same vehicle section as in FIG. 5A. In the embodiment of FIG. 5C, EMI shielding 410a, 410b is provided in both of the locations as described with respect to FIG. 5A and FIG. 5B. A first EMI shielding 410a is located on the deflector plate 412 and a second EMI shielding 410b is located on the external second surface 504. In one embodiment, the first EMI shielding 410a is directly opposite and aligned with the second EMI shielding 410b. In another embodiment, the first and second EMI shielding 410a, 410b are offset from each other. One of the first and second EMI shielding 410a, 410b may be longer than the other.

The electromagnetic wave 108 incident upon the external surfaces 502, 504 will generate an electric surface current 110 along the metallic surface of the aircraft skin that will pass through the gap 506 to the interior 508 where sensitive avionics may be disrupted. Direct illumination of the gap 506 may result in a transmitted wave entering the interior 508. With the EMI shielding assembly described herein, electromagnetic radiation is directed into the space between the external second surface 504 and the deflector plate 412 where it will encounter the EMI shielding 410a, 410b positioned in one of the three configurations described above. The EBG structure 200 incorporated into the EMI shielding 410 will block and attenuate transmission of the electromagnetic radiation further into the interior 508 protecting electronics located therein. For selected geometry combinations of separation distance, height, and via diameter, electromagnetic radiation blockage is possible over a limited band gap frequency range. The separation distance between unit cells 202 acts as a capacitance to the oncoming wave, and the via 208 to ground 204 provides an inductance. When the inductance and capacitance are tuned, the wave sees high-surface impedance as in a band-stop filter. An EBG structure 200 is designed to block a set of modes of electric currents and magnetic fields propagating in a particular platform. The EBG structure 200 may consist of different unit cell 202 or block designs to synthesize an optimal filter performance. The deflector plate 412 converts impinging electromagnetic waves to form a parallel plate mode so that the EBG structure 200 filters out penetrating electromagnetic energy and prevents highly resonant cavity mode build-ups of electromagnetic energy inside the nacelle or other enclosure. The shielding assembly effectively prevents electromagnetic couplings through the open apertures.

Figure 6:
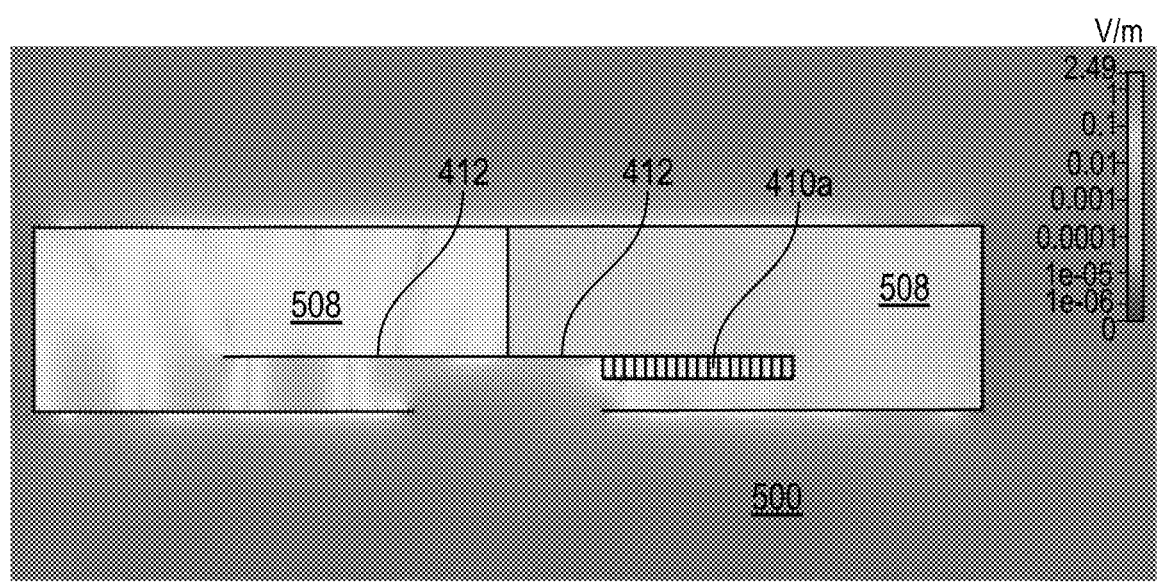
FIG. 6 is an electric field intensity map at a cross-section of a cavity model with no EMI shielding on the left side and with EMI shielding on the right side, according to one or more examples.

FIG. 6 illustrates a test case used to determine how well the EMI shielding assembly described herein performs. FIG. 6 is an electric field intensity map at a cross-section of a 3D cavity model having a deflector plate 412 with no EMI shielding 410 on the left side of FIG. 6 and EMI shielding 410a provided on the deflector plate 412, according to the assembly described with respect to FIG. 5A, on the right side of FIG. 6. A 9×9 unit cell array EBG structure 200 was employed in the model under a plane wave illumination at a stop band frequency. As can be seen in FIG. 6, electrical field intensity of approximately 1.0 V/m at the exterior of the assembly dropped to approximately 0.001 V/m at the interior. The EMI shielding assembly is effective at blocking surface waves from propagating over its band gap range of frequencies. The EBG unit cell 202 may be scaled in size to operate at any desired frequency band. Also, primary EMI shielding 410a can be deployed together with secondary EMI shielding 410b as shown in FIG. 5C for higher filter attenuation levels. The EMI shielding 410 can be easily applied to any open aperture or slot functionally required in aircraft, ships, or other platforms that need efficient protection of on-board electronic/electrical systems against hostile irradiations.

EXAMPLES

Example one includes an assembly for EMI shielding of an interior of an aircraft comprising a first external surface and a second external surface having an inner surface, the first external surface being contiguous with the second external surface and defining a gap therebetween, a deflector plate located in the interior, the deflector plate having a gap-facing surface parallel and adjacent to the inner surface of the second external surface, and a first shielding located on the gap-facing surface, the first shielding including a first electromagnetic band gap structure.

Example two includes the assembly for EMI shielding of Example one and further comprises a second shielding located on the inner surface of the second external surface opposite from the first shielding, the second shielding including a second electromagnetic band gap structure.

Example three includes the assembly for EMI shielding of Example one and further comprises an interior surface connected to the first external surface and extending toward the interior from the first external surface, the deflector plate being connected to the interior surface.

Example four includes the assembly for EMI shielding of Example three, wherein the deflector plate is conductive and located beneath the gap and the second external surface.

Example five includes the assembly for EMI shielding of Example one, wherein the electromagnetic band gap structure includes unit cells, each unit cell comprising a conductive patch and via connected to a ground layer.

Example six includes the assembly for EMI shielding of Example one, wherein the electromagnetic band gap structure is configured to block electromagnetic radiation over a limited band gap frequency range.

Example seven includes the assembly for EMI shielding of Example one, wherein the first shielding includes a conductive adhesive layer.

Example eight includes the assembly for EMI shielding of Example one, wherein the first shielding includes a passivation layer along an outer surface of the electromagnetic band gap structure.

Example nine includes the assembly for EMI shielding of Example one, wherein the interior is an interior of a nacelle and the second external surface is a nacelle access door.

Example ten includes the assembly for EMI shielding of Example one and further includes avionics equipment in the interior.

Example eleven includes the assembly for EMI shielding of Example one, wherein the gap-facing surface of the deflector plate and the inner surface of the second external surface define a distance therebetween configured to establish a parallel plate mode in electromagnetic waves entering the interior through the gap.

Example twelve includes an assembly for EMI shielding of an interior of an aircraft comprising a first external surface and a second external surface having an inner surface, the first external surface being contiguous with the second external surface and defining a gap therebetween, a deflector plate located in the interior and having a gap-facing surface parallel to and opposite from the inner surface of the second external surface, and a first shielding located on the inner surface of the second external surface, the first shielding including a first electromagnetic band gap structure.

Example thirteen includes the assembly for EMI shielding of Example twelve wherein the first shielding includes a first edge and a second edge defining a width of the first shielding, the first edge located near the gap and the second edge located distally from the gap.

Example fourteen includes the assembly for EMI shielding of Example thirteen, wherein the first shielding includes a length perpendicular to the width, the length extending along at least a portion of a perimeter of the second external surface.

Example fifteen includes the assembly for EMI shielding of Example fourteen, wherein the first shielding includes unit cells arrayed along the length and the width of the first shielding, each unit cell comprising a conductive patch and via connected to a ground layer and a dielectric substrate layer extending from the conductive patch to the ground layer.

Example sixteen includes EMI shielding comprising an electromagnetic band gap structure including an array of unit cells across a length and a width, each unit cell comprising a flat conductive patch parallel to the length and width, each patch having an inner surface, and a conductive via connected to the inner surface of the patch, a conductive ground layer having an inner surface and an outer surface, the conductive via extending from the patch to the inner surface of ground layer, a substrate layer of dielectric material located between the patches and the ground layer, and a conductive adhesive layer connected to the outer surface of the ground layer.

Example seventeen includes the EMI shielding of Example sixteen, wherein the shielding is flexible.

Example eighteen includes the EMI shielding of Example sixteen, wherein the patch has a polygonal shape.

Example nineteen includes the EMI shielding of Example sixteen and further includes a passivation layer on a top surface of the electromagnetic band gap structure.

Example twenty includes the EMI shielding of Example sixteen wherein the electromagnetic band gap structure is configured to block electromagnetic radiation over a limited band gap frequency range.

Those skilled in the art will appreciate from the foregoing description that the broad techniques of the examples of the present disclosure can be implemented in a variety of forms. Therefore, while the examples of this disclosure have been described in connection with particular examples thereof, the true scope of the examples of the disclosure should not be so limited since other modifications will become apparent to the skilled practitioner upon a study of the drawings, specification, and following claims.

We claim:

1. An assembly for electromagnetic interference shielding of an interior of an aircraft, comprising:
   a first external surface and a second external surface having an inner surface, the first external surface being contiguous with the second external surface and defining a gap therebetween;
   a deflector plate located in the interior, the deflector plate having a gap-facing surface parallel and adjacent to the inner surface of the second external surface; and
   a first shielding located on the gap-facing surface, the first shielding including a first electromagnetic band gap structure.

2. The assembly of claim 1, further comprising a second shielding located on the inner surface of the second external surface opposite from the first shielding, the second shielding including a second electromagnetic band gap structure.

3. The assembly of claim 1, further comprising an interior surface connected to the first external surface and extending toward the interior from the first external surface, the deflector plate being connected to the interior surface.

4. The assembly of claim 3, wherein the deflector plate is conductive and located beneath the gap and the second external surface.

5. The assembly of claim 1, wherein the electromagnetic band gap structure includes unit cells, each unit cell comprising a conductive patch and via connected to a ground layer.

6. The assembly of claim 1, wherein the electromagnetic band gap structure is configured to block electromagnetic radiation over a limited band gap frequency range.

7. The assembly of claim 1, wherein the first shielding includes a conductive adhesive layer.

8. The assembly of claim 1, wherein the first shielding includes a passivation layer along an outer surface of the electromagnetic band gap structure.

9. The assembly of claim 1, wherein the interior is an interior of a nacelle and the second external surface is a nacelle access door.

10. The assembly of claim 1, further including avionics equipment in the interior.

11. The assembly of claim 1, wherein the gap-facing surface of the deflector plate and the inner surface of the second external surface define a distance therebetween configured to establish a parallel plate mode in electromagnetic waves entering the interior through the gap.

12. An assembly for electromagnetic interference shielding of an interior of an aircraft, comprising:
    a first external surface and a second external surface having an inner surface, the first external surface being contiguous with the second external surface and defining a gap therebetween;
    a deflector plate located in the interior and having a gap-facing surface parallel to and opposite from the inner surface of the second external surface; and
    a first shielding located on the inner surface of the second external surface, the first shielding including a first electromagnetic band gap structure.

13. The assembly of claim 12, wherein the first shielding includes a first edge and a second edge defining a width of the first shielding, the first edge located near the gap and the second edge located distally from the gap.

14. The assembly of claim 13, wherein the first shielding includes a length perpendicular to the width, and the length extending along at least a portion of a perimeter of the second external surface.

15. The assembly of claim 14, wherein the first shielding includes unit cells arrayed along the length and the width of the first shielding, each unit cell comprising a conductive patch and via connected to a ground layer and a dielectric substrate layer extending from the conductive patch to the ground layer.

16. Electromagnetic interference shielding, comprising:
    an electromagnetic band gap structure including:
        an array of unit cells across a length and a width, each unit cell comprising:
            a flat conductive patch parallel to the length and width; each patch having an inner surface; and
            a conductive via connected to the inner surface of the patch;
        a conductive ground layer having an inner surface and an outer surface; the conductive via extending from the patch to the inner surface of ground layer;
        a substrate layer of dielectric material located between the patches and the ground layer; and
    a conductive adhesive layer connected to the outer surface of the ground layer.

17. The shielding of claim 16, wherein the shielding is flexible.

18. The shielding of claim 16, wherein the patch has a polygonal shape.

19. The shielding of claim 16, further including a passivation layer on a top surface of the electromagnetic band gap structure.

20. The shielding of claim 16, wherein the electromagnetic band gap structure is configured to block electromagnetic radiation over a limited band gap frequency range.

\* \* \* \* \*